United States Patent
Chen et al.

(10) Patent No.: US 7,291,553 B2
(45) Date of Patent: Nov. 6, 2007

(54) METHOD FOR FORMING DUAL DAMASCENE WITH IMPROVED ETCH PROFILES

(75) Inventors: Cheng-Ku Chen, Hsinchu (TW); Min-Hwa Chi, Palo Alto, CA (US)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 68 days.

(21) Appl. No.: 11/075,777

(22) Filed: Mar. 8, 2005

(65) Prior Publication Data
US 2006/0205207 A1    Sep. 14, 2006

(51) Int. Cl.
*H01L 21/4763* (2006.01)

(52) U.S. Cl. ............... 438/637; 438/622; 438/623; 438/624; 438/634; 257/E23.001

(58) Field of Classification Search ........... 438/622, 438/623, 624, 634, 637
See application file for complete search history.

(56) References Cited

U.S. PATENT DOCUMENTS

| | | | |
|---|---|---|---|
| 6,387,798 B1* | 5/2002 | Loke et al. | 438/623 |
| 6,440,863 B1* | 8/2002 | Tsai et al. | 438/710 |
| 6,927,495 B2* | 8/2005 | Arita et al. | 257/758 |
| 2003/0119307 A1* | 6/2003 | Bekiaris et al. | 438/638 |
| 2005/0167839 A1* | 8/2005 | Wetzel et al. | 257/758 |
| 2005/0214694 A1* | 9/2005 | Hong et al. | 430/323 |

\* cited by examiner

*Primary Examiner*—Zandra V. Smith
*Assistant Examiner*—Christy L Novacek
(74) *Attorney, Agent, or Firm*—Tung & Associates (57) ABSTRACT

A method for forming a dual damascene with improved profiles including providing a semiconductor process wafer including a dielectric insulating layer and an overlying hardmask layer; forming an uppermost layer of amorphous carbon substantially conformally over the hardmask layer; forming a trench line opening through at least the thickness of the amorphous carbon layer; forming a dual damascene opening comprising forming the trench line opening overlying a via opening pattern through a thickness of the hardmask layer and partially through a thickness of the dielectric insulating layer; and, filling the dual damascene opening with metal.

21 Claims, 7 Drawing Sheets

METHOD FOR FORMING DUAL DAMASCENE WITH IMPROVED ETCH PROFILES

FIELD OF THE INVENTION

This invention generally relates to integrated circuit manufacturing of multi-layered semiconductor devices and more particularly to a method for forming dual damascene structures with improved etching profiles and process flows.

BACKGROUND OF THE INVENTION

The escalating requirements for high density and performance associated with ultra large scale integration semiconductor wiring require increasingly sophisticated interconnection technology. As device sizes decrease it has been increasingly difficult to provide interconnection technology that satisfies the requirements of low resistance and capacitance interconnect properties, particularly as device characteristic dimensions are scaled down to 65 nm and below.

In particular, in forming dual damascenes, processing difficulties arise as device sizes are scaled down. For example as device sizes are scaled down, the behavior of conventional materials in forming hardmasks, anti-reflectance coatings (ARC), and via plugs is critical due to the small process windows as small device dimensions shrink. In addition, defects such as residual material or undesirable etching profiles are magnified in a relative sense with respect to smaller device dimensions.

There are in general two dual Damascene processes commonly practiced in the prior art. One process is typically referred to as a via-first process whereby the via is first patterned and etched through an inter-metal dielectric (i.e. IMD) layer, followed by etching an overlying trench portion. The via first process requires two photolithographic patterning steps for separately forming the via and the trench portions. One main problem in the via first process is commonly known as the "via poison" problem which includes photo-resist interaction and etching damage to the via sidewalls during trench etching. To overcome this problem, prior art processes have proposed several different methods for filling the via with a protective resin material to form a via plug prior to trench etching to protect the via sidewalls. The resin materials is also carefully selected for minimum interaction with the via sidewall, and to improve the trench etching profile. However, the use of resinous via plugs has been found to cause new problems that become more pronounced as trench dimensions are scaled down. For example, new low-k materials used as IMD can cause difficulty in removing via plug material following trench etching as a result of small via size, interaction of resin with new low-k IMD, materials, especially organic based low-k materials, and/or interfering with etching profiles during trench etching. In addition, the resinous via plug materials contaminate etching chambers which can cause increasingly detrimental defects at smaller characteristic device dimensions.

Another approach to forming dual damascenes is referred to as the self aligned dual damascene formation process based on dual hard-mask layers over IMD, where the trench is first patterned over the first hard mask layer, followed by patterning and etching vias over the second hard-mask layer within the patterned trench area, and then followed by simultaneously etching the IMD layer through both the overlying trench and the vias using both hard masks as etching masks during etching IMD. One key to successfully carrying out the self aligned dual damascene formation process is the hardmask material used for patterning the trench. For example, typically CVD nitride is used as one of the materials for the hardmask, which can interact with DUV photoresist during lithographic processes and lead to residual polymeric etching contaminants referred to as photo-resist poisoning. Such residual polymeric defects are difficult to remove and may degrade a wiring electrical resistance or otherwise interfere with a metal filling process thereby degrading device performance and reliability. In addition, such photoresist poisoning also leads to unacceptable contaminant levels in etching reactor chambers, which further leads to unacceptable particulate contamination of the wafer in an etching process.

There is therefore a need in the large scale integrated circuit processing art to develop improved dual damascene manufacturing processes which avoid the various drawbacks of the prior art including improved via protection methods and improved hardmask and ARC formation methods to avoid the various problems of the prior art as well as improve a process flow thereby improving device performance, reliability, and throughput.

It is therefore an object of the invention to provide improved dual damascene manufacturing processes which avoid the various drawbacks of the prior art including improved via protection methods and improved hardmask and ARC formation methods to avoid the various problems of the prior art as well as improve a process flow thereby improving device performance, reliability, and throughput, in addition to overcoming other shortcomings and deficiencies in the prior art.

SUMMARY OF THE INVENTION

To achieve the foregoing and other objects, and in accordance with the purposes of the present invention, as embodied and broadly described herein, the present invention provides a method for forming a dual damascene with improved profiles.

In a first embodiment, the method includes providing a semiconductor process wafer comprising a via opening extending through a dielectric insulating layer thickness and an overlying hardmask layer; forming a layer of amorphous carbon substantially conformally over the hardmask layer to include filling the via opening; patterning a photoresist layer comprising a trench line opening pattern over the amorphous carbon layer overlying the via opening; forming a dual damascene opening according to a dry etching process comprising forming the trench line opening through a thickness portion of the dielectric insulating layer; and, backfilling the dual damascene opening with metal.

In a second embodiment, the method includes providing a semiconductor process wafer including a dielectric insulating layer and an overlying hardmask layer; forming an uppermost layer of amorphous carbon substantially conformally over the hardmask layer; forming a trench line opening through at least the thickness of the amorphous carbon layer; forming a dual damascene opening comprising forming the trench line opening overlying a via opening pattern through a thickness of the hardmask layer and partially through a thickness of the dielectric insulating layer; and, filling the dual damascene opening with metal.

These and other embodiments, aspects and features of the invention will become better understood from a detailed description of the preferred embodiments of the invention which are described in conjunction with the accompanying drawings.

DETAILED DESCRIPTION OF THE PREFERRED EMBODIMENTS

Although the method of the present invention is particularly advantageous for forming dual damascenes for wiring integrated circuits with characteristic dimensions less than about 0.13 microns including 65 nm and below, e.g., having a via diameter of about 0.12 microns or less, it will be appreciated that the method of the present invention may be applied to larger characteristic dimensioned integrated circuits and via diameters. The method of the present invention is particularly advantageous in reliably preventing damage to via sidewalls, avoiding the problems of photoresist and via poisoning, and reducing a number of processing steps to improve a process flow.

It will further be appreciated that the method may be applicable to dual damascenes with or without middle etch stop layers formed between dielectric insulating layers (i.e. IMD) to separate a via portion and trench portion of the dual damascene, although a middle etch stop layer is less preferred due to an undesirable capacitance contribution. For example, preferably a single dielectric insulating layer (i.e. IMD), preferably low-K (low dielectric constant e.g., less than about 3.0) is used in the dual damascene structure.

Figure 1A:
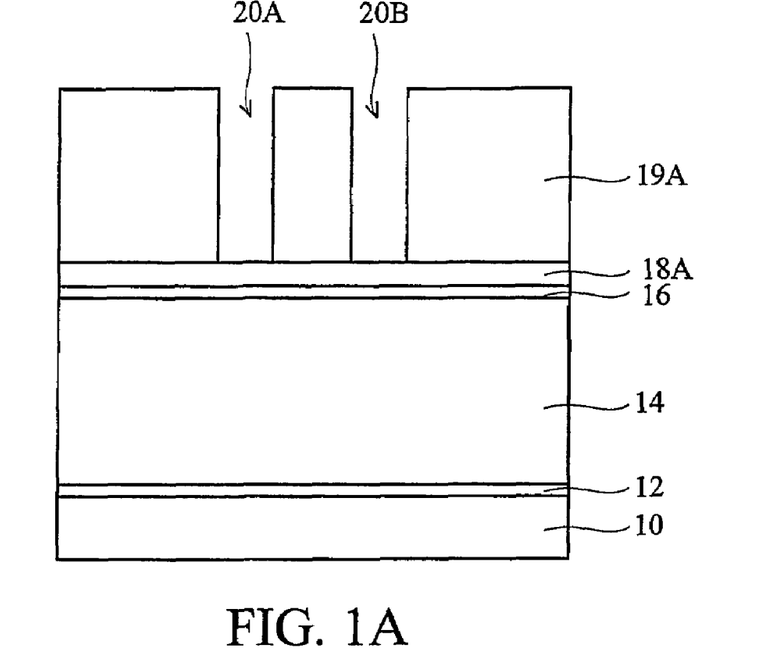
FIGS. 1A-1G are exemplary cross sectional views of a dual damascene structure at stages in manufacturing according to an embodiment of the present invention.

For example, in a first exemplary embodiment, referring to FIGS. 1A-1G, are shown schematic cross sectional views of a portion of a multi-level semiconductor device at stages in a via first dual damascene manufacturing process. Referring to FIG. 1A is shown a conductive region 10, for example, copper, having an overlying first etching stop layer 12, for example, silicon nitride (e.g., SiN), silicon oxynitride, silicon carbide (SiC), or silicon oxycarbide (SiOC) or combination thereof, most preferably silicon carbide (SiC). First etching stop layer 12 is formed by a conventional chemical vapor deposition (CVD) process preferably a plasma enhanced CVD (PECVD) or HDP-CVD process at a thickness of about 100 Angstroms to 500 Angstroms depending on device characteristic dimension design rules.

Still referring to FIG. 1A, formed over etching stop layer 12 is dielectric insulating layer 14, also referred to as an inter-metal dielectric (IMD) layer, preferably formed of a low-K (low dielectric constant) material, preferably carbon doped silicon oxide, organo-silicate glass (OSG), fluorinated silicon oxide (FSG), or combinations thereof. For example, the low-K IMD layer 14 is formed by a CVD process, preferably by HDP-CVD or PECVD to a thickness of between about 500 to about 3000 Angstroms, depending on design rules. Most preferably, the IMD layer is formed of organo-silicate glass (OSG), for example Black Diamond™, available from Applied Materials Corporation. Preferably, the low-K IMD layer 14 has a dielectric constant of less than about 3.2, more preferably less than about 2.8.

Formed over the IMD layer 14 is preferably formed a dielectric anti-reflectance coating (DARC) layer 16, preferably an inorganic material that also functions as an etching hardmask. For example, silicon nitride, silicon oxynitride or silicon oxycarbide are preferably used as a DARC/hardmask layer 16. For example, the inorganic DARC layer 16 is formed to an appropriate thickness to reduce light reflections by index matching. The DARC layer is formed by conventional methods, e.g. HDP-CVD, PECVD or LPCVD.

Still referring to FIG. 1A, formed overlying the DARC layer 16 is preferably formed an organic bottom anti-reflectance coating (BARC) layer 18A, for example a cured negative photoresist or photo-inactive organic resinous layer with light absorbing properties at a photo-patterning wavelength, followed by formation of an overlying photoresist layer 19A, preferably a deep ultraviolet (DUV) photoresist, for example being photoactive at wavelengths of less than about 245 nm including 193 and 157 nm. The BARC layer 18A and the DUV photoresist layer 19A are applied at conventional thicknesses by a spin-on and curing process. It will be appreciated that the DUV photoresist may include silicon monomers to increase a dry etching resistance. A via pattern is then formed in the photoresist layer 19A according to a conventional photolithographic patterning process to form via opening patterns e.g., 20A and 20B.

Figure 1B:
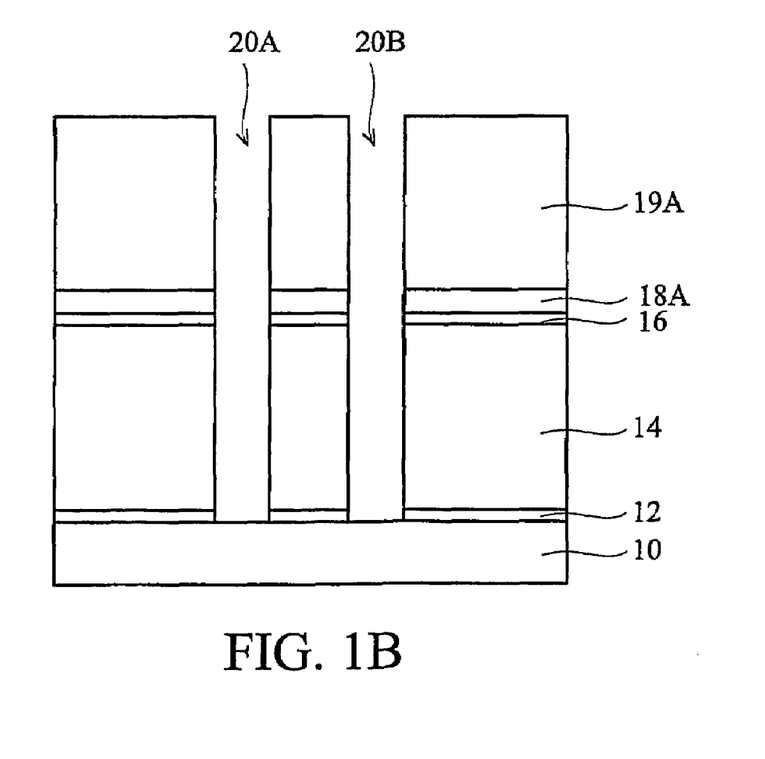

Referring to FIG. 1B, the via opening patterns are then etched (transferred) through the BARC layer 18A, the DARC layer 16, and the dielectric insulating layer 14 thickness sequentially and finally to stop on the etch stop layer 12 by a multi-step plasma assisted etching process, to form via openings e.g., 20A and 20B. In the etching process, the BARC layer 18A and the DARC layer 16 are sequentially etched by using oxygen/nitrogen etching chemistry, and the IMD layer 14 is etched by using fluorocarbon and/or hydrofluorocarbon etching chemistry.

Figure 1C:
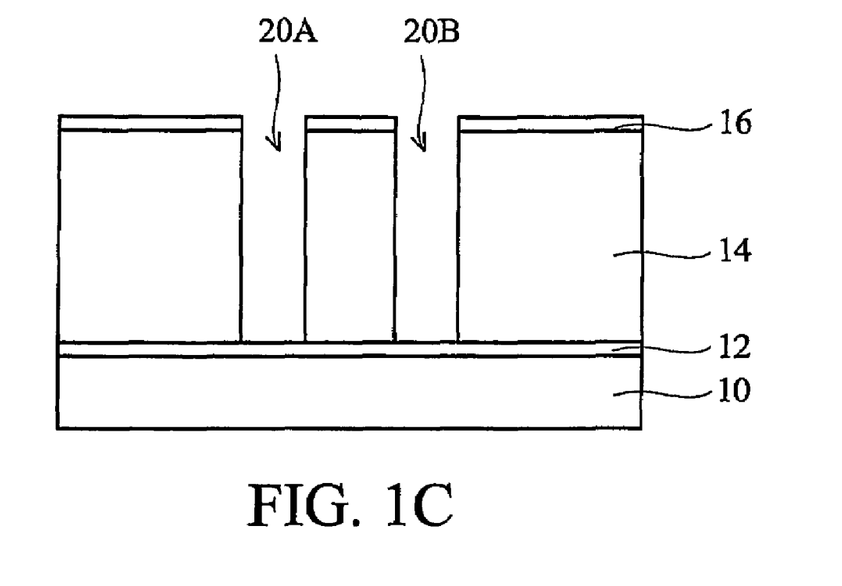

Referring to FIG. 1C, following etching of via openings e.g., 20A and 20B, the photoresist layer 19A and the BARC layer 18A are removed, preferably in-situ, by a plasma stripping process, for example a plasma chemistry including oxygen with optional nitrogen and/or fluorocarbon plasma source gas added during the plasma stripping process.

Figure 1D:
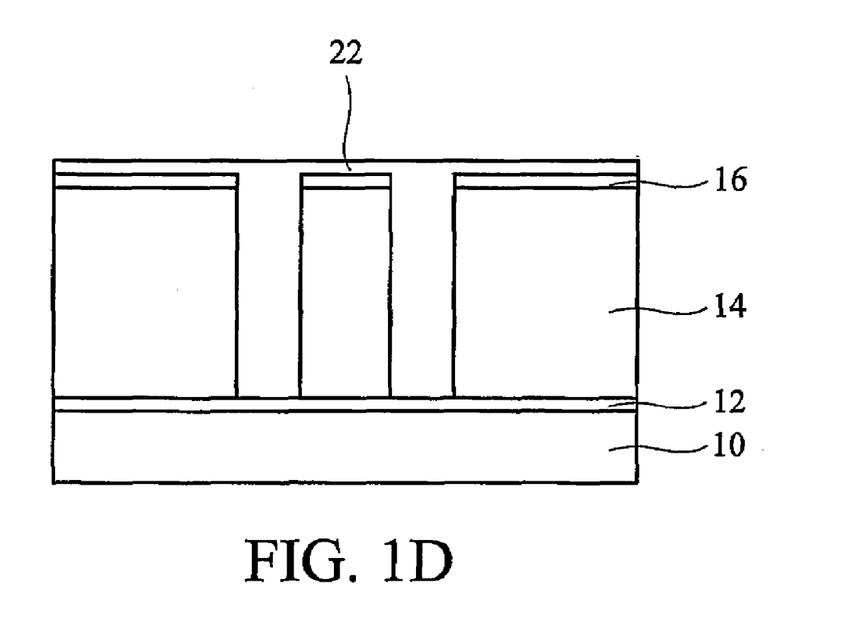

Referring to FIG. 1D, according to an important aspect of the present invention, an amorphous carbon layer 22 is then substantially conformally deposited to backfill the via openings e.g., 20A and 20B including forming an overlying portion over the DARC layer 16 to seal (close) the via openings. It will be appreciated that a narrow seam (not shown e.g., several angstroms) may form vertically at a centerline portion of the backfilled via openings where the conformally deposited amorphous carbon layers from the sidewalls meet to form an interface. The amorphous carbon layer 22 is preferably formed by CVD methods, most preferably HDP-CVD or PECVD, preferably at a temperature of from about 300° C. to 450° C. The amorphous carbon layer 22 above the DARC layer 16 is formed at a thickness of from about 400 to 700 Angstroms depending on the via opening diameter and depth. The amorphous carbon layer 22 may optionally be partially etched back by an $H_2/O_2$ plasma to reduce a thickness of the amorphous carbon layer 22 overlying the DARC layer 16. It is expected and preferred that the amorphous carbon layer 22 will be of appropriate thickness following the deposition and/or partial etching in order to act as an ARC layer in a subsequent trench patterning process.

Figure 1E:
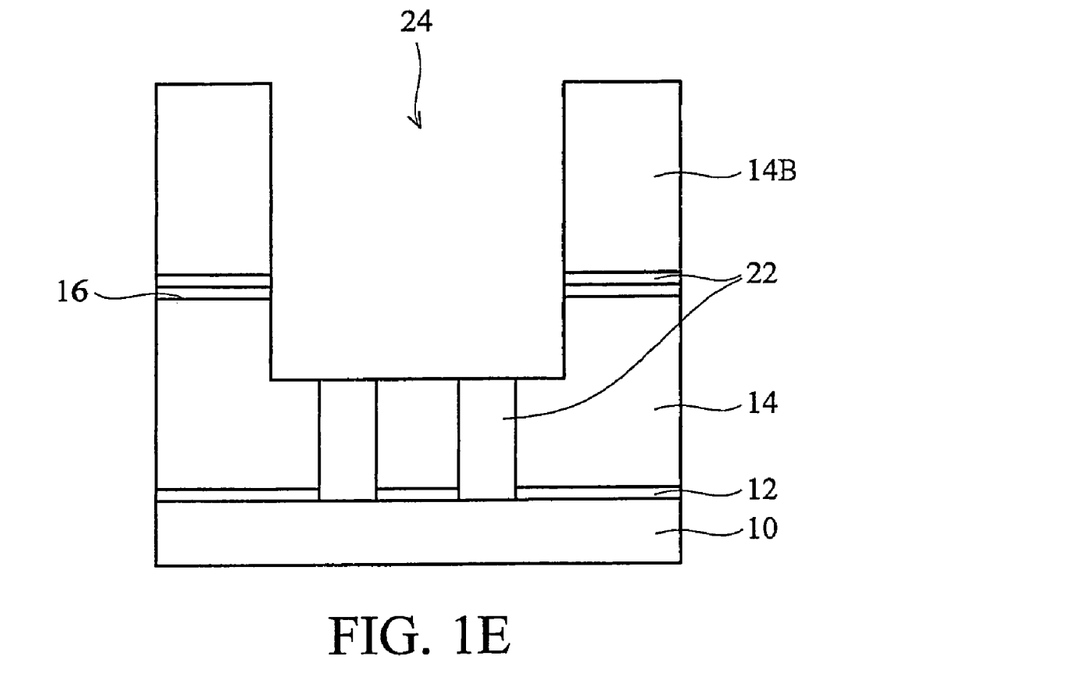

Referring to FIG. 1E, a second photoresist layer 19B, similar to first photoresist layer 19A is then formed over the amorphous carbon layer 22 and the photoresist layer 19B is patterned to form a trench opening pattern 24 by a conventional photolithographic patterning process. Advantageously, according the present invention, a second BARC layer is not applied prior to the trench patterning process since the amorphous carbon layer 22 left remaining overlying the DARC layer 16 advantageously acts as an ARC layer in the trench patterning process. A conventional plasma etching process including fluorocarbons and/or fluorohydrocarbons as well as oxygen and/or nitrogen is then carried out to substantially anisotropically etch the trench opening pattern 24 through the amorphous carbon layer 22 and the DARC layer 16 and partially into the IMD layer 14 for a predetermined time period to reach an appropriate trench line depth.

Advantageously, during the plasma etching process, the low-K IMD layer and the amorphous carbon layer 22 filling vias are etched at about the same rate, thereby providing improved protection to the via opening sidewalls without associated problems related to variable etching rates and accumulated polymeric etching residues from via plug materials of the prior art, thereby improving dual damascene etching profiles.

Figure 1F:
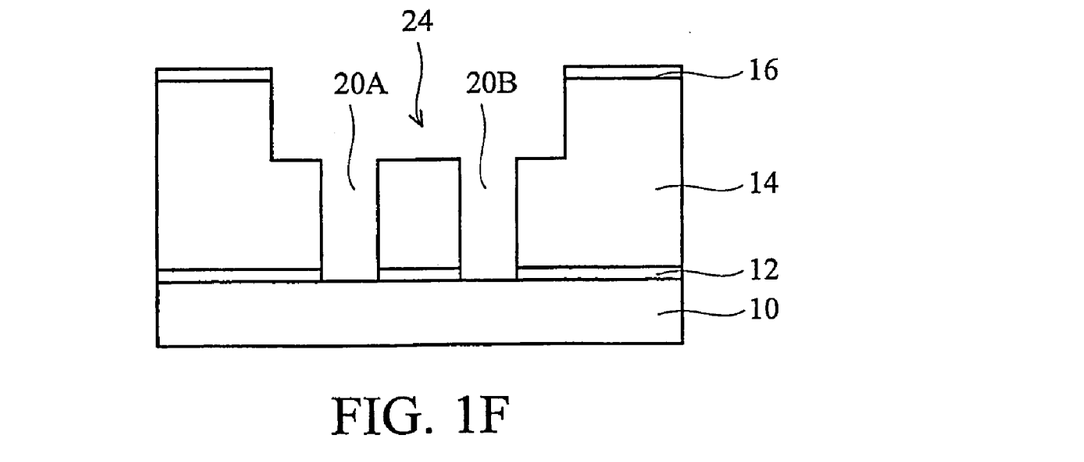

Referring to FIG. 1F, following stripping the remaining portions of second resist layer 19B and amorphous carbon layer 22 preferably using an $H_2/O_2$ plasma chemistry (e.g., $H_2/O_2$ plasma source gases), a conventional dry etching process is then carried out to remove the etch stop layer 12 from the bottom of the remaining portion of via openings 20A, 20B to form dual damascene opening.

Figure 1G:
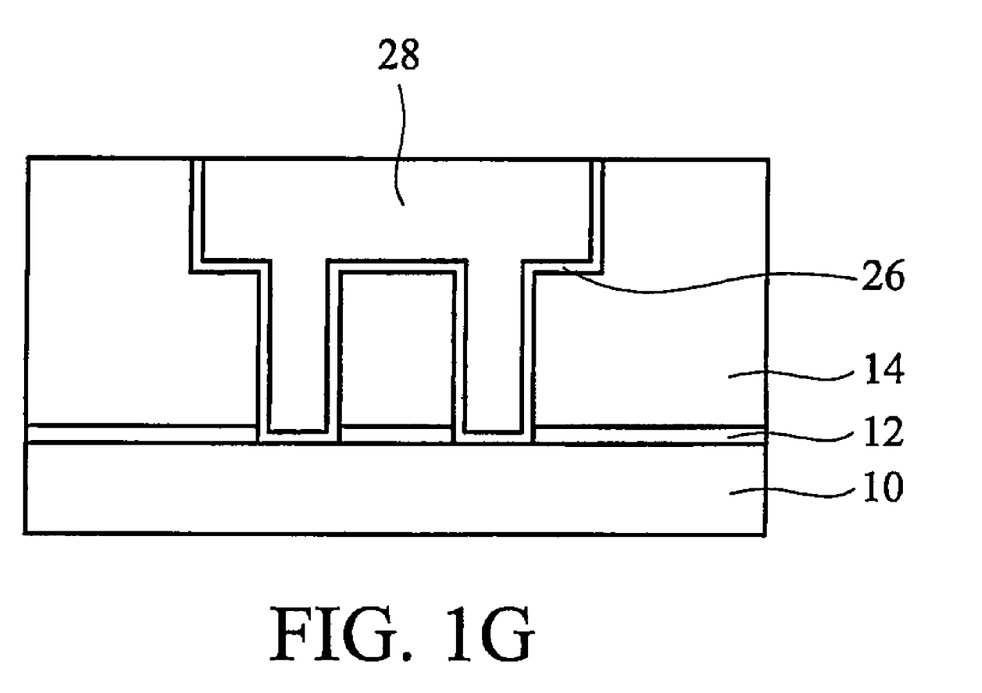

Referring to FIG. 1G, conventional processes are then carried out to complete the formation of the dual damascene. For example, preferably the dual damascene opening including via openings e.g., 20A and 20B are lined with a refractive metal nitride barrier layer 26, preferably tantalum nitride (e.g., TaN). A copper seed layer is then deposited by PVD, followed by electrochemical deposition (ECD) of copper 28 to fill the dual damascene. A conventional planarization, e.g., CMP process is then carried out to remove excess copper on the surface including the DARC layer 16 and barrier layer 26 above the IMD layer 14 for forming a dual damascene backfilled with copper.

Figure 2A:
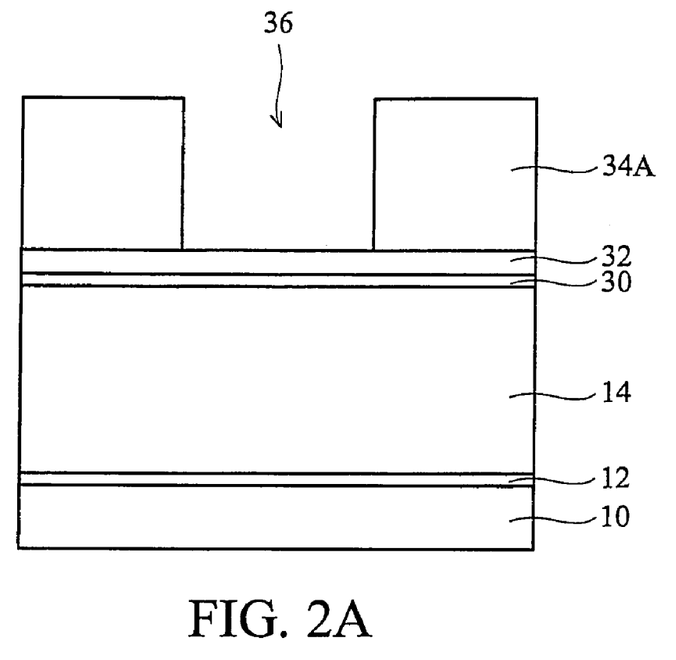
FIGS. 2A-2D are exemplary cross sectional views of a dual damascene structure at stages in manufacturing according to an embodiment of the present invention.

Referring to FIGS. 2A-2D, in another embodiment, the dual damascene is formed by a self-aligned process. Referring to FIG. 2A, in this embodiment, an undoped silicate glass (USG) layer 30 is formed over the IMD layer 14 followed by formation of an amorphous carbon layer 32. A photoresist layer 34A is then formed and patterned with a trench opening 36, followed by transferring the trench opening pattern through a thickness of the amorphous carbon layer 32 by a dry etching process using the USG layer as etching stop.

Figure 2B:
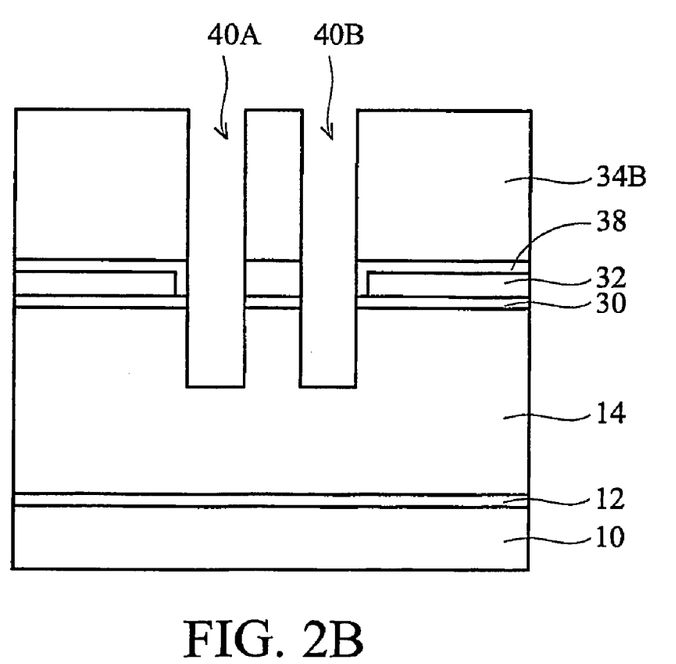

Referring to FIG. 2B, the photoresist layer 34A is then stripped by a wet or dry stripping process followed by formation of a spin-on BARC layer 38 including filling the trench opening pattern 36 formed in the amorphous carbon layer followed by formation of a second photoresist layer 34B and patterning via opening patterns e.g., 40A and 40B.

Still referring to FIG. 2B, the via opening patterns e.g., 40A and 40B are then transferred by plasma etching through the underlying BARC layers 38, USG layer 30, and partially through the IMD layer 14 by a timed etching process. Or alternatively, after the via pattern is transferred to USG layer 30, the photo-resist 34B and BARC layer 38 are removed. Then the IMD layer 14 is partially etched by a timed etching process using USG 30 and carbon layer 32 as etching mask. For example, the via openings e.g., 40A and 40B are etched to a depth about ½ or greater of the IMD layer 14 thickness.

Figure 2C:
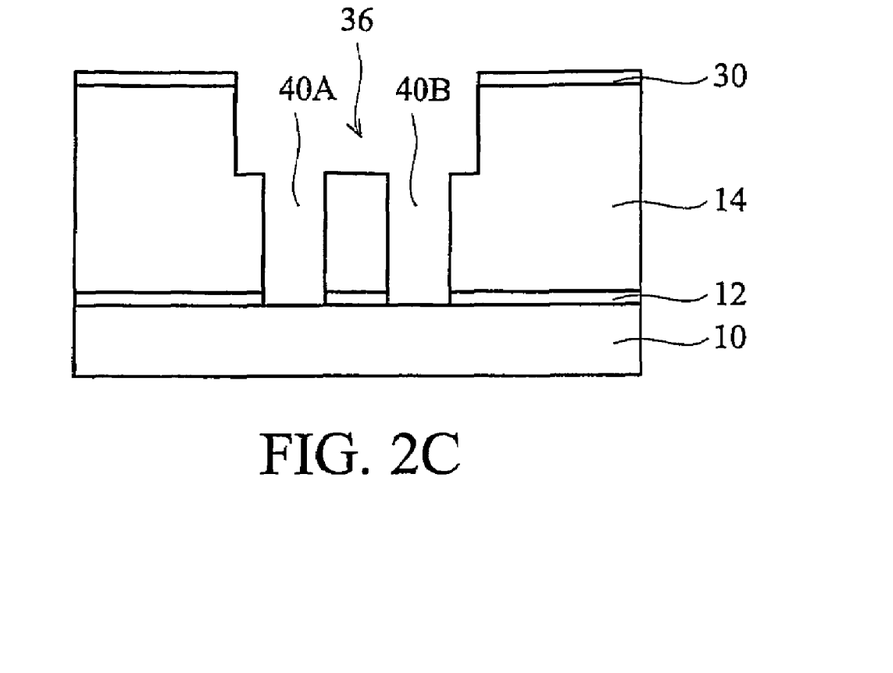

Referring to FIG. 2C, following stripping of the BARC layer 38 and the photoresist layer 34B to expose the trench opening pattern 36 formed in the amorphous carbon layer 32, a plasma etching process is carried out to etch the trench opening pattern 36 using the amorphous carbon layer 32 as an etching mask to an appropriate trench depth while simultaneously extending the depth of the via openings e.g., 40A and 40B. The etch stop layer 12 is then removed at the bottom of the via openings e.g., 40A and 40B followed by removing the overlying amorphous carbon layer 32, preferably by an $(H_2/O_2)$ plasma etching (ashing) process.

Figure 2D:
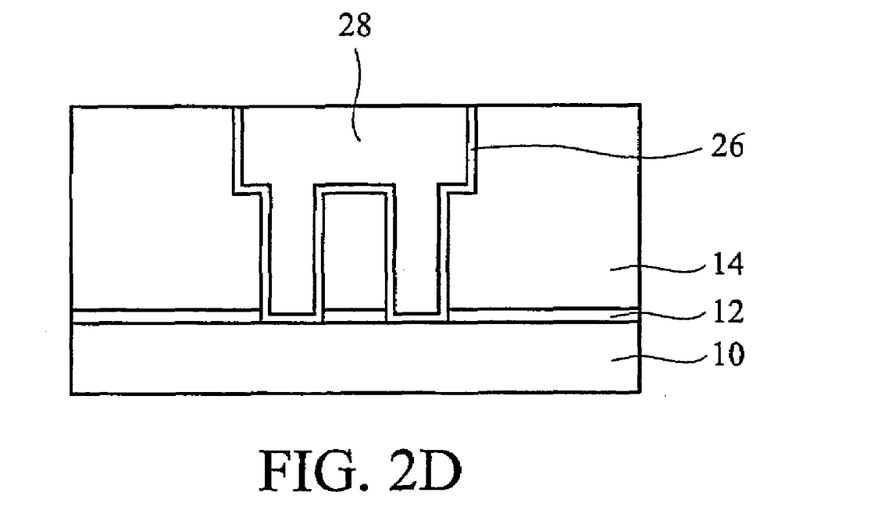

Referring to FIG. 2D, subsequent conventional processes as previously outlined are then carried out to backfill the dual damascene opening with copper 28 including removing the USG layer 30 and barrier layer 26 overlying the IMD layer 14.

Thus, according to the present invention, methods for forming dual damascenes have been presented including a via first process and a self aligned process using amorphous carbon films (layers) to take advantage of amorphous carbon film properties to improve a process flow and quality of dual damascene formation including etching profiles. In a via first process i.e. the first embodiment, amorphous carbon is used as a via filling material and has the added advantage of acting as an ARC layer thereby avoiding the problems attendant with etching and removing via filling materials and BARC layers formed of organic resinous materials thereby improving a process flow and etching profiles. By using amorphous carbon as a hardmask in the self aligned process the second embodiment, the problems associated with conventional hard masks such as silicon nitride including photoresist poisoning and polymeric etching residue accumulation are avoided, thereby reducing defect formation and improving etching profiles.

Figure 3:
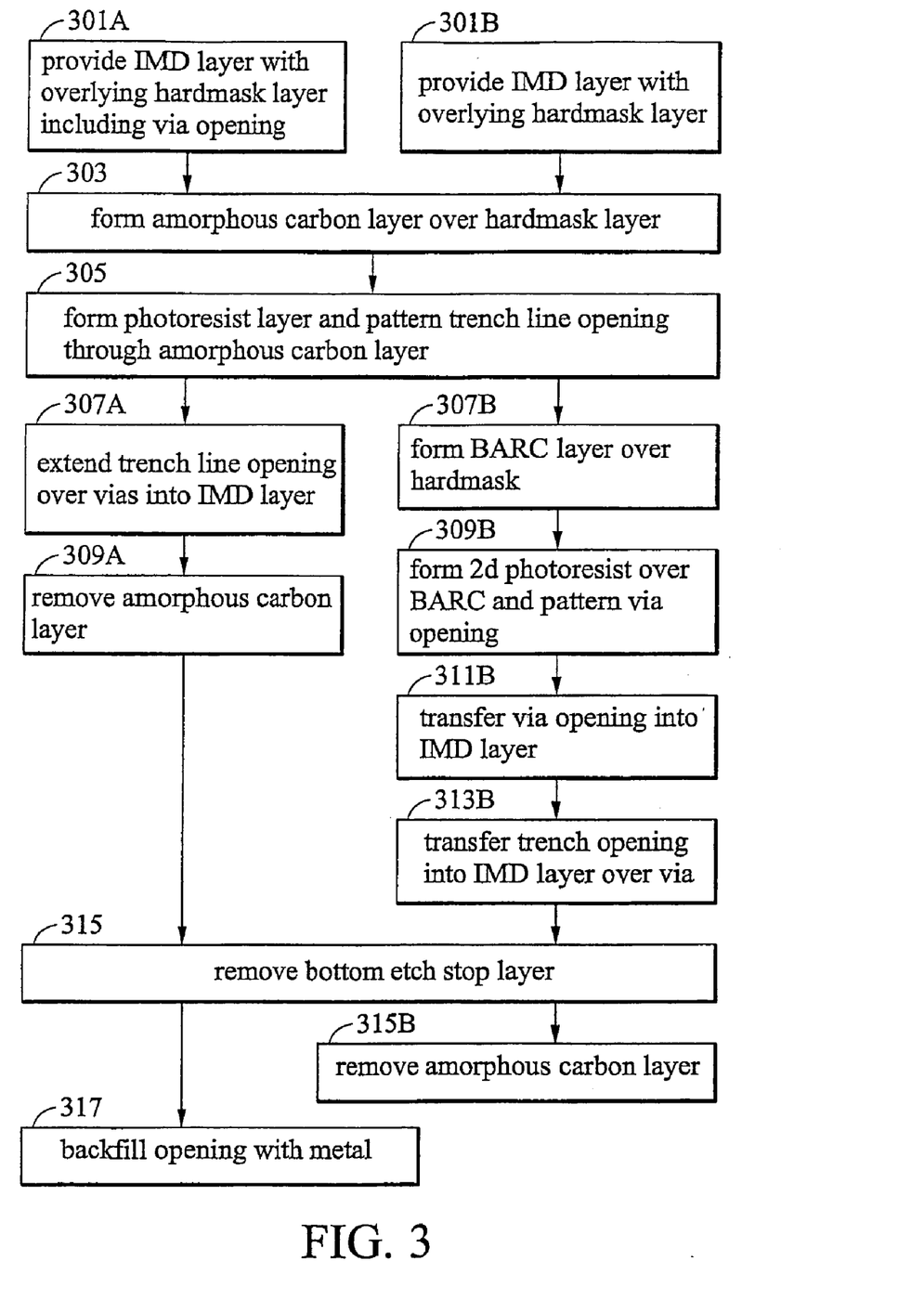
FIG. 3 is a process flow diagram including several embodiments of the present invention.

Referring to FIG. 3 is shown a process flow diagram including several embodiments of the present invention. In processes 301A (via first embodiment) and 301B (self aligned embodiment), a semiconductor wafer substrate is provided comprising an IMD layer and an uppermost hardmask layer and in embodiment A (via first process) including one or more via openings extending through the IMD layer thickness. In process 303 for both embodiments an amorphous carbon layer is formed over the hardmask layer including backfilling the one or more via openings in embodiment A. In process 305 for both embodiments, a photoresist layer is formed over the amorphous carbon layer and patterned to form a trench line opening pattern extending through the amorphous carbon layer thickness.

In process 307A (via first embodiment) the trench line opening pattern is then etched through a thickness of the hardmask layer and partially through a thickness of the IMD layer to form a trench line opening. In process 309A (via first embodiment) the remaining amorphous carbon layer filling the one or more via openings is removed to form a dual damascene opening.

In process 307B (self aligned embodiment), a BARC layer is formed over the trench line patterning opening in the amorphous carbon layer. In process 309B, a second photoresist layer patterned and via opening patterns formed. In process 311B the via opening patterns are transferred through partially through a thickness of the IMD layer. In process 313B, the trench line opening pattern over the via openings is then transferred partially through the dielectric insulating layer to form a dual damascene opening.

In process 315 for both embodiments, the etch stop layer at the bottom of the via opening is removed. In process 315B, the amorphous carbon layer is removed. In process 317 for both embodiments, conventional processes including barrier layer formation, ECD copper deposition and CMP are carried out to complete the dual damascene formation process.

The preferred embodiments, aspects, and features of the invention having been described, it will be apparent to those skilled in the art that numerous variations, modifications, and substitutions may be made without departing from the spirit of the invention as disclosed and further claimed below.

What is claimed is:

1. A method for forming a dual damascene with improved profiles comprising the steps of:
providing a semiconductor process wafer comprising a dielectric insulating layer and an overlying hardmask layer;
forming a via opening extending through a thickness of the hardmask layer and dielectric insulating layer;
forming an uppermost layer of amorphous carbon substantially conformally over the hardmask layer following the step of forming the via opening by filling said via opening;
forming a trench line opening through at least the thickness of the amorphous carbon layer;
forming a dual damascene opening comprising forming the trench line opening overlying the via opening pattern through a thickness of the hardmask layer and partially through a thickness of the dielectric insulating layer; and
filling the dual damascene opening with metal.

2. The method of claim 1, wherein removing comprises a plasma ashing process comprising an $O_2$ and $H_2$ plasma source gases.

3. The method of claim 1 further comprising removing an etch stop layer at the bottom of the via opening.

4. The method of claim 1, wherein the hardmask layer is selected from the group consisting of silicon nitride, silicon oxynitride, silicon carbide, and silicon oxycarbide.

5. The method of claim 1, wherein the dielectric insulating layer comprises a low-K dielectric insulating layer selected from the group consisting of carbon doped silicon oxide, organo-silicate glass (OSG), and fluorinated silicate glass (FSG).

6. The method of claim 5, wherein the low-K dielectric insulating layer has a dielectric constant is less than about 3.0.

7. A method for forming a dual damascene with improved profiles comprising the steps of:
providing a semiconductor process wafer comprising a via opening extending through a dielectric insulating layer thickness and an overlying hardmask layer;
forming a layer of amorphous carbon substantially conformally over the hardmask layer to include filling the via opening;
patterning a photoresist layer comprising a trench line opening pattern over the amorphous carbon layer overlying the via opening;
forming a dual damascene opening according to a dry etching process comprising forming the trench line opening through a thickness portion of the dielectric insulating layer; and,
backfilling the dual damascene opening with metal.

8. The method of claim 7, wherein the step of forming a dual damascene opening further comprises removing the amorphous carbon layer from the via opening bottom portion.

9. The method of claim 8, wherein removing comprises a plasma ashing process comprising an $O_2$ and $H_2$ plasma source gases.

10. The method of claim 8, further comprising removing an etch stop layer at the bottom of the via opening.

11. The method of claim 10, wherein the etch stop layer comprises silicon carbide.

12. The method of claim 7, wherein the hardmask layer is selected from the group consisting of silicon nitride, silicon oxynitride, silicon carbide, and silicon oxycarbide.

13. The method of claim 7, wherein the amorphous carbon layer is formed by a PECVD process at a temperature of about 300° C. to about 450° C.

14. The method of claim 7, wherein the dielectric insulating layer comprises a low-K dielectric insulating layer selected from the group consisting of carbon doped silicon oxide, and organosilicate glass (OSG).

15. The method of claim 7, wherein the dielectric insulating layer comprises a low-K dielectric insulating layer having a dielectric constant is less than about 3.0.

16. A method for forming a dual damascene with improved profiles comprising the steps of:
providing a semiconductor process wafer comprising a dielectric insulating layer and an overlying hardmask layer;
forming a via opening extending through a thickness of the hardmask layer and dielectric insulating layer;
forming an uppermost layer of amorphous carbon substantially conformally over the hardmask layer following the step of forming the via opening by filling said via opening;
forming a trench line opening through at least the thickness of the amorphous carbon layer;
forming a dual damascene opening comprising forming the trench line opening overlying the via opening pattern through a thickness of the hardmnask layer and partially through a thickness of the dielectric insulating layer; and removing the amorphous carbon layer from the via opening;
filling the dual damascene opening with metal.

17. The method of claim 16, wherein removing comprises a plasma ashing process comprising an $O_2$ and $H_2$ plasma source gases.

18. The method of claim 16 further comprising removing an etch stop layer at the bottom of the via opening.

19. The method of claim 16, wherein the hardmask layer is selected from the group consisting of silicon nitride, silicon oxynitride, silicon carbide, and silicon oxycarbide.

20. The method of claim 16, wherein the dielectric insulating layer comprises a low-K dielectric insulating layer selected from the group consisting of carbon doped silicon oxide, organo-silicate glass (OSG), and fluorinated silicate glass (FSG).

21. The method of claim 16, wherein the low-K dielectric insulating layer has a dielectric constant is less than about 3.0.

* * * * *